United States Patent
Suzuki (10) Patent No.: US 7,663,438 B2
(45) Date of Patent: Feb. 16, 2010

(54) DIFFERENTIAL AMPLIFIER CIRCUIT

(75) Inventor: Hisao Suzuki, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 4 days.

(21) Appl. No.: 12/186,291

(22) Filed: Aug. 5, 2008

(65) Prior Publication Data

US 2009/0091385 A1 Apr. 9, 2009

(30) Foreign Application Priority Data

Oct. 4, 2007 (JP) ............................. 2007-260515

(51) Int. Cl.
*H03F 3/45* (2006.01)
(52) U.S. Cl. ...................... 330/253; 330/297; 330/133
(58) Field of Classification Search ................. 330/253, 330/297, 133
See application file for complete search history.

(56) References Cited

U.S. PATENT DOCUMENTS

| | | | |
|---|---|---|---|
| 5,028,882 A * | 7/1991 | Marrah et al. ............... | 330/254 |
| 5,900,780 A * | 5/1999 | Hirose et al. ................ | 330/253 |
| 6,677,818 B2 * | 1/2004 | Singor et al. ................ | 330/133 |
| 7,279,982 B1 * | 10/2007 | Zhou et al. .................. | 330/301 |
| 7,282,994 B2 * | 10/2007 | Gopinathan et al. ......... | 330/253 |

OTHER PUBLICATIONS

Yoshio Shirato; "*All About Analog ICs in Illustration*"; First Edition Second Print; Nov. 10, 1987; Tokyo Denki University Publishing Division.

\* cited by examiner

*Primary Examiner*—Patricia Nguyen
(74) *Attorney, Agent, or Firm*—Arent Fox LLP (57) ABSTRACT

A differential amplifier circuit of simple circuit configuration is disclosed, which is capable of releasing an output signal within a voltage range independent of the voltage range of a differential input signal. The differential amplifier circuit 1 includes: NMOS transistors N1, N2 that constitute a first differential pair configured to input a differential input voltage; a resistor element Ra connected to drain terminals X1, X2 of the NMOS transistors N1, N2; an op-amp OP having input terminals connected to the drain terminals X1, X2; and NMOS transistors N3, N4 that constitute a second differential pair configured to input an output voltage of the op-amp OP and a reference voltage. The drain terminals of the first differential pair are connected to drain terminals, respectively, of the second differential pair.

11 Claims, 11 Drawing Sheets

CIRCUIT DIAGRAM OF CONFIGURATION OF DIFFERENTIAL
AMPLIFIER CIRCUIT OF FIRST EMBODIMENT

FIG. 1

CIRCUIT DIAGRAM OF CONFIGURATION OF DIFFERENTIAL AMPLIFIER CIRCUIT OF FIRST EMBODIMENT

FIG. 2
CIRCUIT DIAGRAM OF CONCRETE EXAMPLE OF CONSTANT CURRENT SOURCES

FIG. 3

CIRCUIT DIAGRAM OF CONCRETE EXAMPLE OF CONSTANT CURRENT SOURCES

FIG. 4

CIRCUIT DIAGRAM OF CONDITION OF COMPONENTS OF DIFFERENTIAL AMPLIFIER CIRCUIT WHEN VOLTAGE OF IP IS EQUAL TO VOLTAGE OF IM

FIG. 5

CIRCUIT DIAGRAM (1) OF CONDITION OF COMPONENTS OF DIFFERENTIAL AMPLIFIER CIRCUIT WHEN VOLTAGE OF IP IS HIGHER THAN VOLTAGE OF IM

FIG. 6

CIRCUIT DIAGRAM (2) OF CONDITION OF COMPONENTS OF DIFFERENTIAL AMPLIFIER CIRCUIT WHEN VOLTAGE OF IP IS HIGHER THAN VOLTAGE OF IM

FIG. 7

CIRCUIT DIAGRAM OF CONFIGURATION OF DIFFERENTIAL AMPLIFIER CIRCUIT OF SECOND EMBODIMENT

FIG. 8

CIRCUIT DIAGRAM OF CONDITION OF COMPONENTS OF DIFFERENTIAL AMPLIFIER CIRCUIT WHEN VOLTAGE OF IP IS EQUAL TO VOLTAGE OF IM

FIG. 9

CIRCUIT DIAGRAM (1) OF CONDITION OF COMPONENTS OF DIFFERENTIAL AMPLIFIER CIRCUIT WHEN VOLTAGE OF IP IS HIGHER THAN VOLTAGE OF IM

FIG. 10

CIRCUIT DIAGRAM (2) OF CONDITION OF COMPONENTS OF DIFFERENTIAL AMPLIFIER CIRCUIT WHEN VOLTAGE OF IP IS HIGHER THAN VOLTAGE OF IM

FIG. 11 (PRIOR ART) CIRCUIT DIAGRAM OF CONFIGURATION OF DIFFERENTIAL AMPLIFIER CIRCUIT ns, p. 45, FIG. 2-18 (issued on Nov. 10, 1987 by Tokyo Denki University Publishing Division). Practically, each input terminal needs

DIFFERENTIAL AMPLIFIER CIRCUIT

CROSS-REFERENCE TO RELATED APPLICATIONS

This application is based upon and claims the benefit of priority from the prior Japanese Patent Application No. 2007-260515 filed on Oct. 4, 2007, the entire contents of which are incorporated herein by reference.

BACKGROUND

1. Field

The present disclosure relates to a differential amplifier circuit configured to release an output voltage independently of the voltage range of a differential input voltage.

2. Description of Related Art

Figure 11:
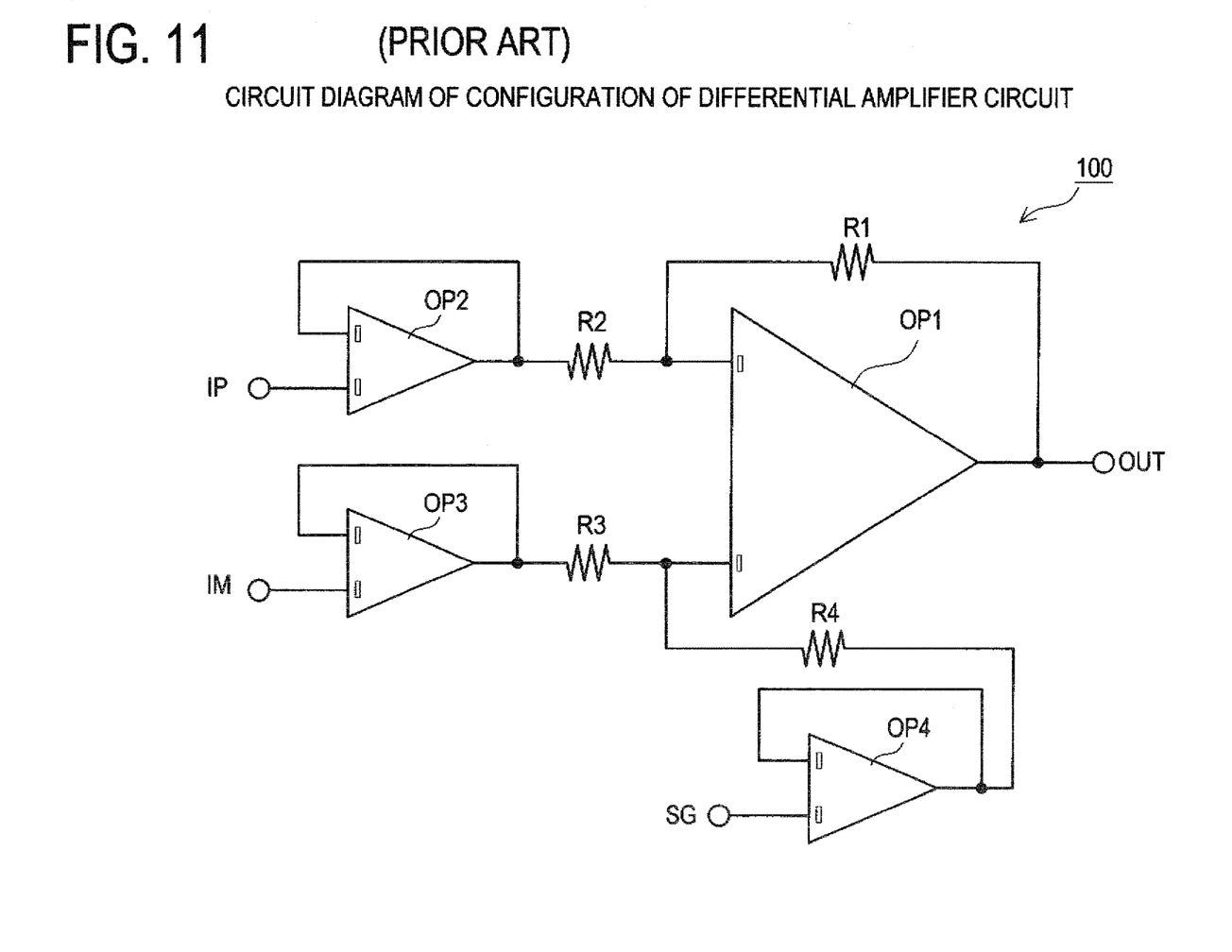
FIG. 11 is a circuit diagram showing the configuration of a differential amplifier circuit.

An example of differential amplifier circuits having a Norton amplifier is disclosed in SHIRATO Yoshio, "All About Analog ICs in Illustration" the first edition, p. 45, FIG. 2-18 (issued on Nov. 10, 1987 by Tokyo Denki University Publishing Division). Practically, each input terminal needs to be connected to an op-amp configured as a voltage follower, in order to make the impedance at the input terminal high. FIG. 11 is a circuit diagram showing the configuration of a differential amplifier circuit 100. This differential amplifier circuit 100 includes op-amps OP1, OP2, OP3, OP4 and resistor elements R1, R2, R3, R4. The op-amp OP1 functions as the Norton amplifier noted above, whereas the op-amps OP2, OP3, OP4 are each configured as a voltage follower in order to make the input impedances at the input terminals IP, IM, SG high. The input terminals IP, IM input a differential input signal. The input terminal SG inputs a reference voltage esg. The op-amp OP1 constitutes a differential amplifier in conjunction with the resistor elements R1, R2, R3, R4. An output terminal OUT releases a differential amplifier output in response to the differential input signal, based on the reference voltage esg.

SUMMARY

One aspect includes a differential amplifier circuit which comprises a voltage/current converting section that operates at a first supply voltage to convert a differential voltage of a differential input voltage into a current according to the differential voltage; and a current/voltage converting section that operates at a second supply voltage independent of the first supply voltage to convert a current output from the voltage/current converting section into a voltage according to the current, thereby outputting an output voltage based on the voltage and a reference voltage.

DETAILED DESCRIPTION OF PREFERRED EMBODIMENTS

Figure 1:
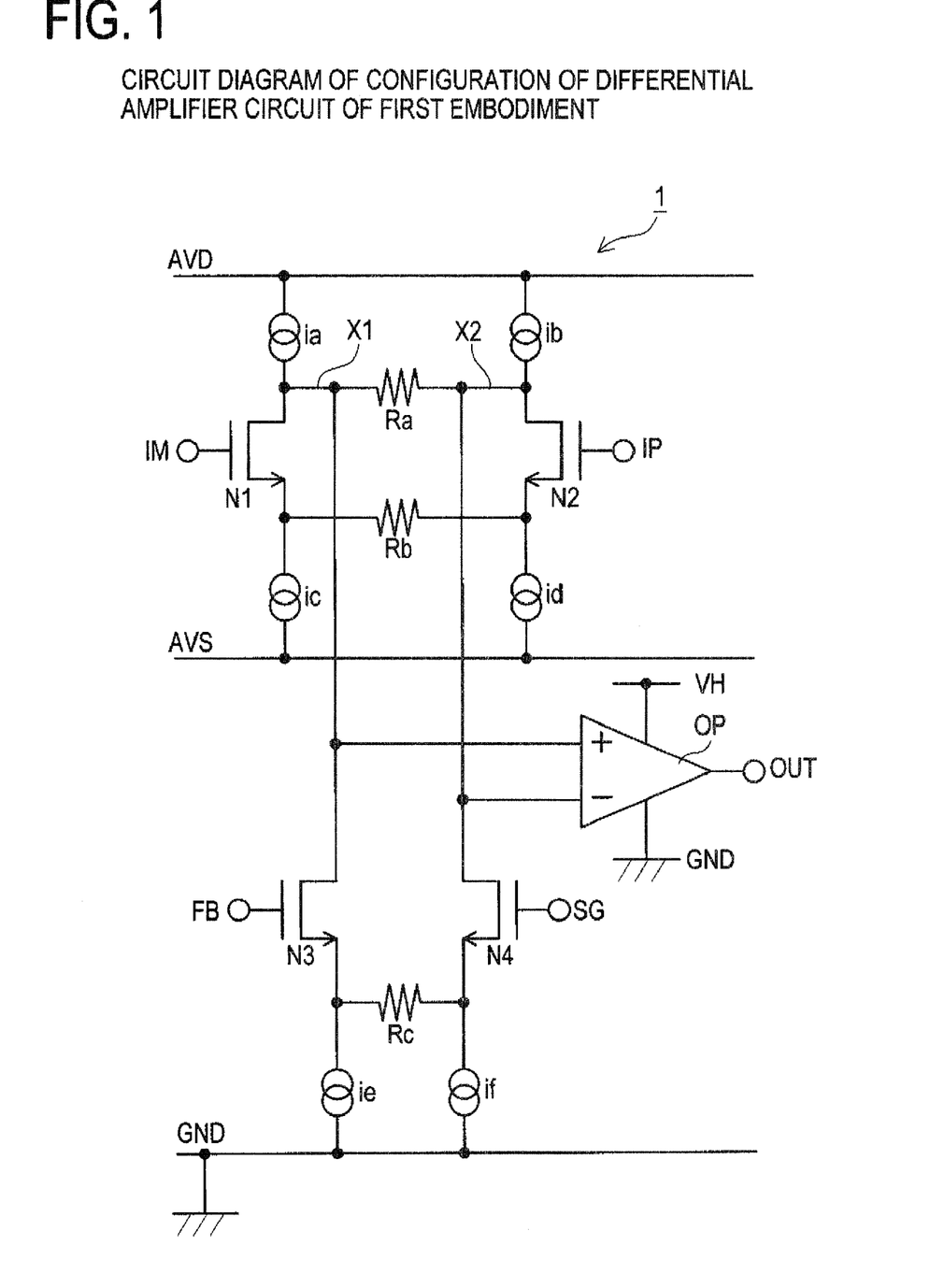
FIG. 1 is a circuit diagram showing the configuration of the differential amplifier circuit of the first embodiment.

First of all, a differential amplifier circuit 1 will be explained according to a first embodiment. FIG. 1 is a circuit diagram showing the configuration of the differential amplifier circuit 1 of the first embodiment.

The differential amplifier circuit 1 includes NMOS transistors N1, N2, N3, N4, constant current sources ia, ib, ic, id, ie, if, resistor elements Ra, Rb, Rc and an op-amp OP. The NMOS transistors N1, N2 and the resistor element Rb constitute a first differential pair whereas the NMOS transistors N3, N4 and the resistor element Rc constitute a second differential pair. Herein, the NMOS transistors N1, N2 have the same transistor size and the NMOS transistors N3, N4 have the same transistor size.

The NMOS transistors N1 has a source terminal to which one end of the constant current source ic is connected, a gate terminal to which an input terminal IM is connected, and a drain terminal to which a node X1 is connected. The NMOS transistors N2 has a source terminal to which one end of the constant current source id is connected, a gate terminal to which an input terminal IP is connected, and a drain terminal to which a node X2 is connected. Connected between the source terminal of the NMOS transistor N1 and the source terminal of the NMOS transistor N2 is the resistor element Rb. The other end of each of the constant current sources ic and id is connected to a first ground voltage AVS.

The NMOS transistors N3 has a source terminal to which one end of the constant current source ie is connected, a gate terminal to which a feedback terminal FB is connected, and a drain terminal to which the node X1 is connected. Although not shown in FIG. 1, the feedback terminal FB is normally connected to the output terminal OUT of the op-amp OP. The NMOS transistors N4 has a source terminal to which one end of the constant current source if is connected, a gate terminal to which a signal ground terminal SG is connected, and a drain terminal to which the node X2 is connected. Connected between the source terminal of the NMOS transistor N3 and the source terminal of the NMOS transistor N4 is the resistor element Rc. The other end of each of the constant current sources ie and if is connected to the second ground voltage GND.

Connected to the node X1 is one end of the constant current source ia. Connected to the node X2 is one end of the constant current source ib. Connected between the node X1 and the node X2 is the resistor element Ra. The op-amp OP has a noninverting terminal connected to the node X1 and an inverting terminal connected to the node X2. The other end of each of the constant current sources ia and ib is connected to a first supply voltage AVD. In addition, the op-amp OP is connected to a second supply voltage VH and a second ground voltage GND which are set independently of the first supply voltage AVD and the first ground voltage AVS.

Herein, a current equal to that of the constant current source ib flows in the constant current source ia, a current equal to that of the constant current source id flows in the constant current source ic, and a current equal to the constant current source if flows in the constant current source ie. The current flowing in the constant current source ia is the sum current of the current flowing in the constant current source ic and the current flowing in the constant current source ie. The current flowing in the constant current source ib is the sum current of the current flowing in the constant current source id and the current flowing in the constant current source if.

Figure 2:
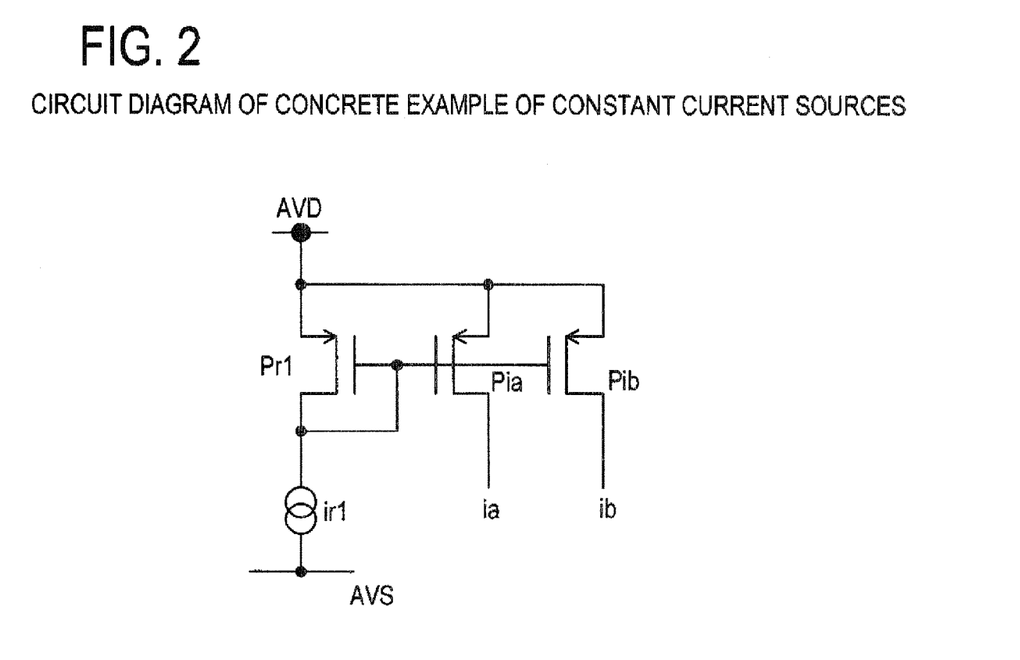
FIG. 2 is a circuit diagram showing a concrete example of the constant current sources.

Next, the constant current sources ia, ib will be described. FIG. 2 is a circuit diagram that shows a concrete example of the constant current sources ia, ib. The constant current sources ia, ib have the same circuit configuration and include PMOS transistors Pr1, Pia, Pib and a constant current source ir1 one end of which is connected to the first ground voltage AVS.

The PMOS transistor Pr1 has a drain terminal connected to the other end of the constant current source ir1 and to the gate terminal of the transistor Pr1 itself. The drain terminal of the PMOS transistor Pr1 is connected to the gate terminal of the PMOS transistor Pia and to the gate terminal of the PMOS transistor Pib.

Thereby, the PMOS transistor Pr1 and the PMOS transistors Pia, Pib constitute a current mirror circuit. Therefore, a current equal to the current flowing in the PMOS transistor Pr1 flows in the PMOS transistors Pia, Pib. That is, the current of the constant current source ir1 flows in the PMOS transistors Pia, Pib, thereby establishing the constant current sources ia, ib.

Figure 3:
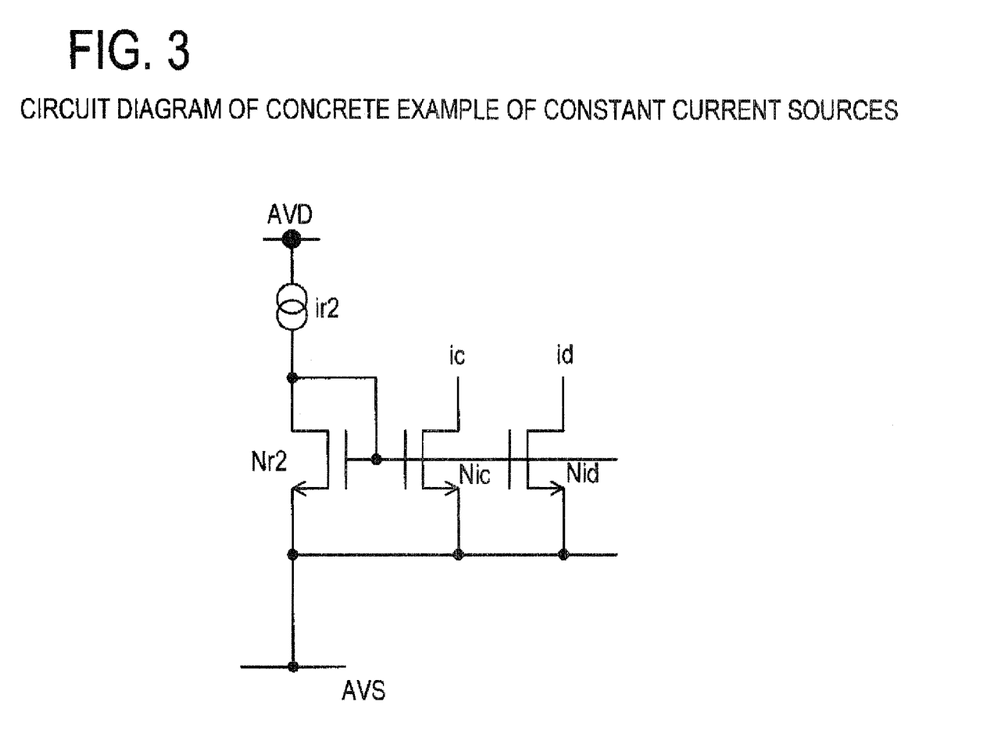
FIG. 3 is a circuit diagram showing a concrete example of the constant current sources.

Next, the constant current sources ic, id will be described. FIG. 3 is a circuit diagram showing a concrete example of the constant current sources ic, id. The constant current sources ic, id have the same circuit configuration and include NMOS transistors Nr2, Nic, Nid and a constant current source ir2 one end of which is connected to the first supply voltage AVD.

The NMOS transistor Nr2 has a drain terminal connected to the other end of the constant current source ir2 and to the gate terminal of the transistor Nr2 itself. The drain terminal of the NMOS transistor Nr2 is connected to the gate terminal of the NMOS transistor Nic and to the gate terminal of the NMOS transistor Nid.

Thereby, the NMOS transistor Nr2 and the NMOS transistors Nic, Nid constitute a current mirror circuit. Therefore, a current equal to the current flowing in the NMOS transistor Nr2 flows in the NMOS transistors Nic, Nid. That is, the current of the constant current source ir2 flows in the NMOS transistors Nic, Nid, thereby establishing the constant current sources ic, id.

The constant current sources ie, if are connected to the second supply voltage VH and the second ground voltage GND instead of the first supply voltage AVD and the first ground voltage AVS shown in FIG. 3. The circuit configuration of the constant current sources ie, if does not differ from that of FIG. 3 except the above point.

Figure 4:
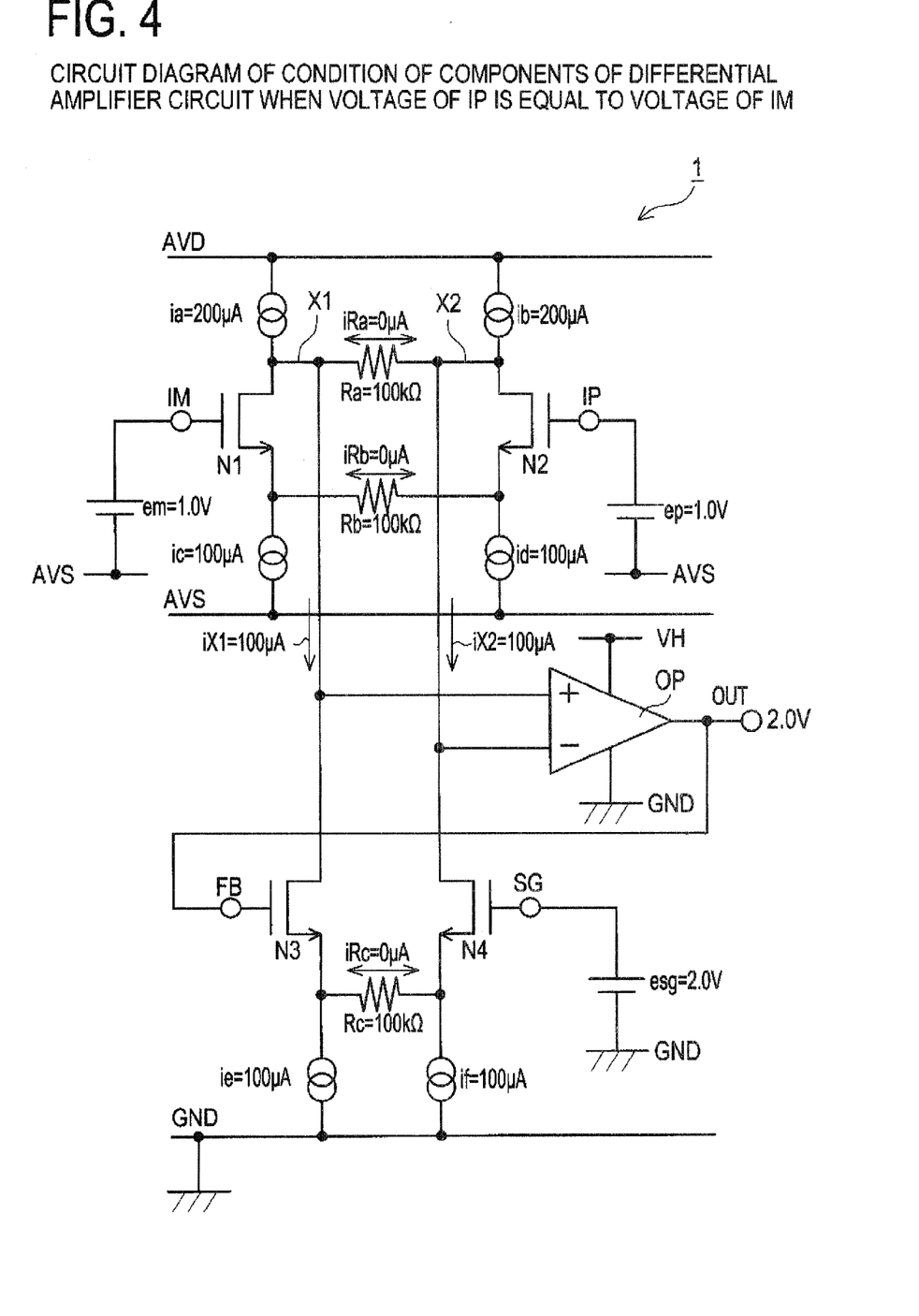
FIG. 4 is a circuit diagram showing the respective conditions of the components of the differential amplifier circuit when the voltage of IP is equal to the voltage of IM.

Next, the operation of the differential amplifier circuit 1 when the voltage of the input terminal IP is equal to the voltage of the input terminal IM will be explained. FIG. 4 is a circuit diagram showing the respective conditions of the components of the differential amplifier circuit 1.

Herein, the currents of the constant current sources ia, ib are each set to 200 μA and the currents of the constant current sources ic, id, ie, if are each set to 100 μA. The resistance values of the resistor elements Ra, Rb, Rc are each set to 100 kΩ. The feedback terminal FB is connected to the output terminal OUT and the signal ground terminal SG is connected to the reference voltage esg=2.0V.

If 1.0V is applied to the input terminals IM and IP at that time, the source terminal of the NMOS transistor N1 and the source terminal of the NMOS transistor N2 will have the same voltage because the gate-source voltage of the NMOS transistor N1 is equal to the gate-source voltage of the NMOS transistor N2. Accordingly, no voltage difference will appear between both ends of the resistor element Rb and therefore no current will flow in the resistor element Rb.

Since no current flows in the resistor element Rb, all the current flowing in the constant current source ic flows in the NMOS transistor N1 and all the current flowing in the constant current source id flows in the NMOS transistor N2. Both of the currents flowing in the NMOS transistors N1 and N2 are 100 μA. The differential current between the current (200 μA) flowing in the constant current source ia and the current (100 μA) flowing in the NMOS transistor N1 is 100 μA. And, all of the differential current of 100 μA flows into the constant current source ie of 100 μA through the NMOS transistor N3. The differential current between the current (200 μA) flowing in the constant current source ib and the current (100 μA) flowing in the NMOS transistor N2 is 100 μA. And, all of the differential current of 100 μA flows into the constant current source if of 100 μA through the NMOS transistor N4. That is, the current from the constant current source ia flows into the NMOS transistors N1, N3 whereas the current from the constant current source ib flows into the NMOS transistors N2, N4, so that no current flows in the resistor element Ra and no voltage difference appears between both ends of the resistor element Ra.

All of the current (100 μA) to be flown by the constant current source ie is supplied through the NMOS transistor N3, whereas all of the current (100 μA) to be flown by the constant current source if is supplied through the NMOS transistor N4. Therefore, the current flowing into the constant current sources ie and if does not flow through the resistor element Rc. Thereby, the voltage difference between both ends of the resistor element Rc becomes 0V. As a result, the source terminals of the NMOS transistors N3, N4 have the same voltage.

In addition, since the NMOS transistors N3, N4 are of the same transistor size, the gate-source voltage of the NMOS transistor N3 and the gate-source voltage of the NMOS transistor N4 operate at the same voltage. Therefore, the gate voltage of the NMOS transistor N3 and the gate voltage of the NMOS transistor N4 must have the same value.

The op-amp OP operates such that the gate voltages of the NMOS transistor N3 and the NMOS transistor N4 become equal to each other. Since the signal ground terminal SG, which is the gate voltage of the NMOS transistor N4, is 2.0V, the op-amp OP operates such that the feedback terminal FB, which is the gate voltage of the NMOS transistor N3, becomes 2.0V, and the voltage value of the output terminal OUT becomes 2.0V.

The second supply voltage VH and second ground voltage GND supplied to the op-amp OP are set independently of the first supply voltage AVD and the first ground voltage AVS which are supplied to the first differential pair having the NMOS transistors N1, N2 connected to the input terminals IM, IP, respectively. Therefore, the reference voltage esg applied to the signal ground terminal SG is not limited to 2.0V but can be arbitrarily set, and an output signal within a voltage range corresponding to the set reference voltage is output from the feedback terminal FB (output terminal OUT).

Figure 5:
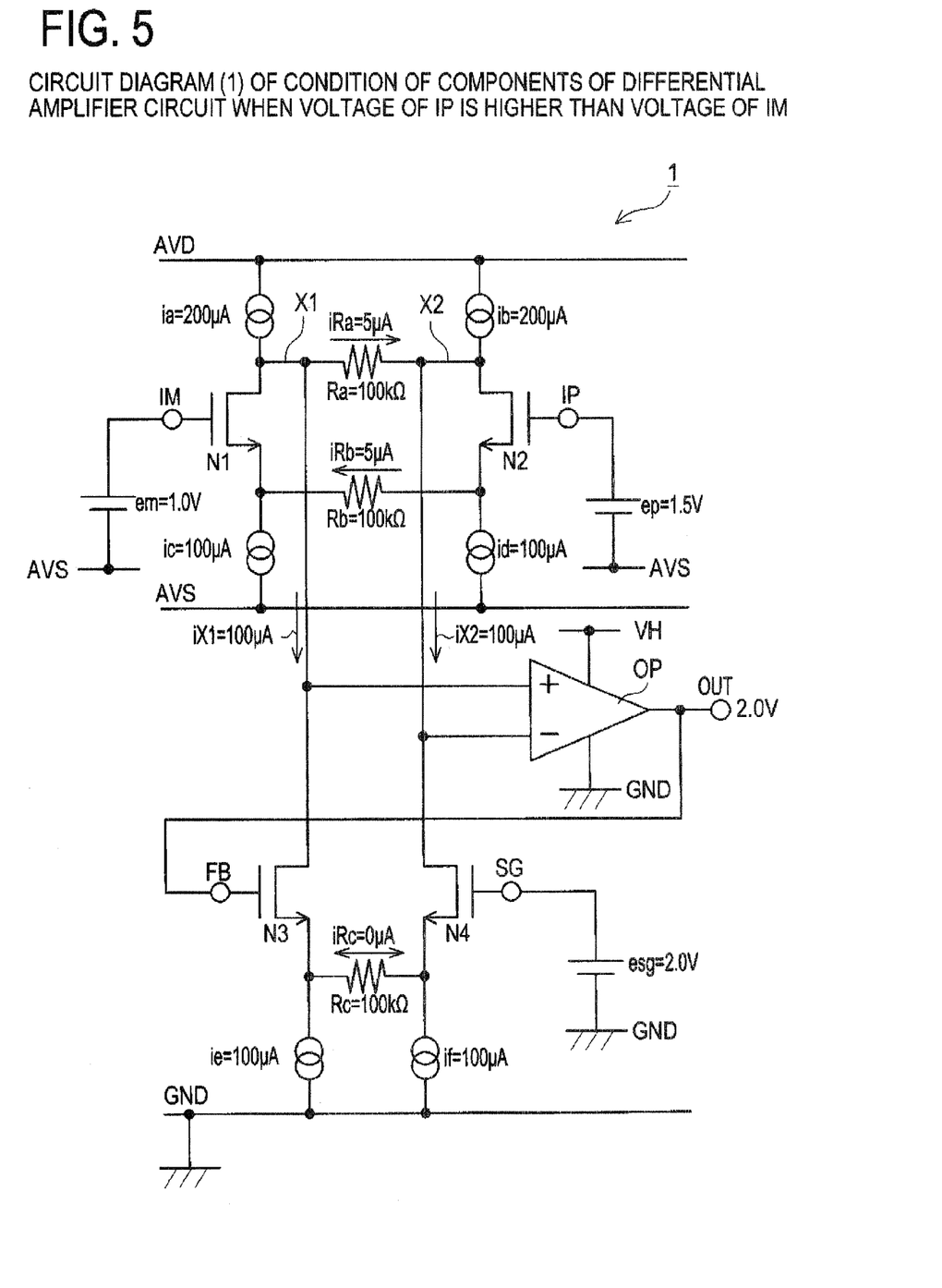
FIG. 5 is a circuit diagram (1) showing the respective conditions of the components of the differential amplifier circuit when the voltage of IP is higher than the voltage of IM.
Figure 6:
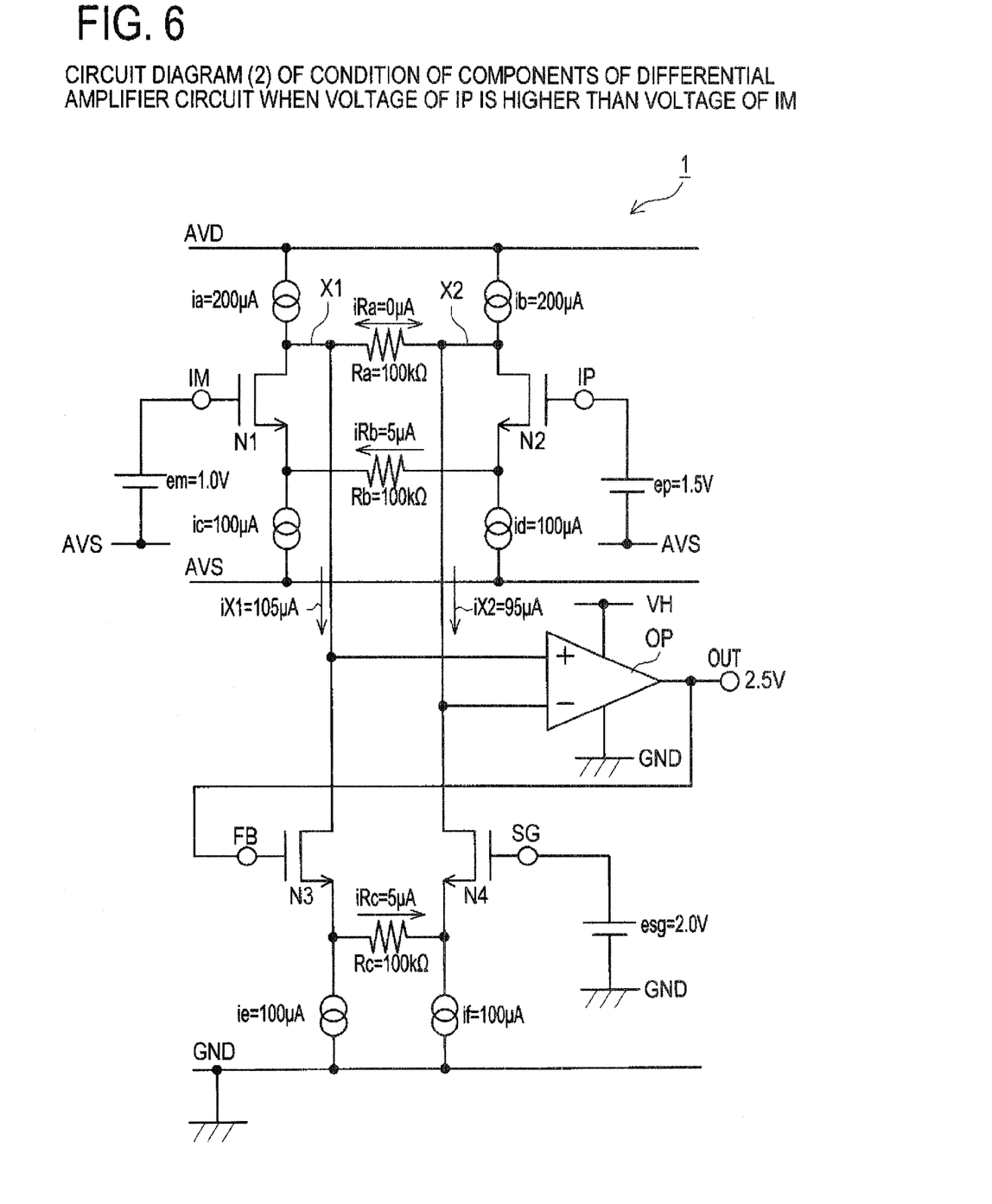
FIG. 6 is a circuit diagram (2) showing the respective conditions of the components of the differential amplifier circuit when the voltage of IP is higher than the voltage of IM.

Next, the operation of the differential amplifier circuit 1 when the voltage of the input terminal IP is higher than the voltage of the input terminal IM will be explained. FIGS. 5 and 6 are circuit diagrams each showing the respective conditions of the components of the differential amplifier circuit 1. Specifically, FIG. 5 shows a transitional state just after the voltage of the input terminal IP has changed, whereas FIG. 6 shows a state in which the components have been restored to their respective normal states.

Similarly to FIG. 4, the currents of the constant current sources ia, ib are each set to 200 μA and the currents of the constant current sources ic, id, ie, if are each set to 100 μA. The resistance values of the resistor elements Ra, Rb, Rc are each set to 100 kΩ. The feedback terminal FB is connected to the output terminal OUT and the signal ground terminal SG is connected to the reference voltage esg=2.0V.

In FIG. 5, if 1.0V is applied to the input terminal IM and 1.5V is applied to the input terminal IP, a voltage of 0.5V will be applied across the resistor element Rb because the gate-source voltage of the NMOS transistor N1 is equal to the gate-source voltage of the NMOS transistor N2. Since the resistance value of the resistor element Rb is 100 kΩ, a current of 5 μA will flow from the source terminal side of the NMOS transistor N2 to the source terminal side of the NMOS transistor N1 in the resistor element Rb.

Since the current flowing in the constant current sources ic, id is constantly kept at 100 μA, the current flowing in the NMOS transistor N1 becomes 95 μA that is obtained by subtracting the current (5 μA) flowing in the resistor element Rb from the current (100 μA) flowing in the constant current source ic. The current flowing in the NMOS transistor N2 becomes 105 μA that is obtained by adding the current (5 μA) flowing in the resistor element Rb to the current (100 μA) flowing in the constant current source id.

The current left after subtraction of the current flowing in the NMOS transistor N1 from the constant current source ia is 105 μA. The current left after subtraction of the current flowing in the NMOS transistor N2 from the constant current source ib is 95 μA. Each of the constant current sources ie, if is a 100 μA constant current source. Therefore, the current of 105 μA, which is left after the subtraction of the current flowing in the NMOS transistor N1 from the constant current source ia, branches into two currents, one being 100 μA that flows in the NMOS transistor N3 in a direction toward the constant current source ie as the node current iX1, whereas the other is 5 μA that flows in a direction toward the constant current source if through the resistor element Ra, as a part of the node current iX2. After the current of 95 μA, which is left after the subtraction of the current flowing in the NMOS transistor N2 from the constant current source ib, is added to the node current iX2, the node current iX2 flows in the NMOS transistor N4 in a direction toward the constant current source if.

The current flowing in the resistor element Ra is 5 μA. Since the resistance value of the resistor element Ra is 100 kΩ, a voltage difference of 0.5V appears between both ends of the resistor element Ra with the drain terminal side of the NMOS transistor N1 having higher potential. At that time, the gate voltages of the NMOS transistor N3 and the NMOS transistor N4 have not changed yet and therefore, a voltage difference has not appeared between both ends of the resistor element Rc. Therefore, no current does not flow in the resistor element Rc.

The current flowing in the resistor element Rc is dependent upon the source voltage difference between the NMOS transistor N3 and the NMOS transistor N4. Since the NMOS transistor N3 and the NMOS transistor N4 have the same gate-source voltage, the gate voltage difference between them has to be controlled. The gate voltage of the NMOS transistor N4 is equal to the reference voltage esg=2.0V applied to the signal ground terminal SG, and the gate voltage of the NMOS transistor N3 is equal to the voltage of the output terminal OUT of the op-amp OP connected to the feedback terminal FB.

Input to the noninverting input terminal and inverting input terminal of the op-amp OP is a voltage difference that has appeared between both ends of the resistance element Ra. The op-amp OP operates so as to eliminate the voltage difference between the noninverting input terminal and the inverting input terminal, because its output terminal OUT is connected to the feedback terminal FB that is the gate terminal of the NMOS transistor N3. More concretely, the op-amp OP operates in a direction in which 5 μA flowing from the constant current source ia into the resistor element Ra is eliminated to null the voltage difference between both ends of the resistor element Ra, that is, a direction in which the node current iX1 flowing in the NMOS transistor N3 is increased by 5 μA while the node current iX2 flowing in the NMOS transistor N4 being reduced by 5 μA.

FIG. 6 shows a state where the node current iX1 flowing in the NMOS transistor N3 has been increased by 5 μA so that it becomes 105 μA and the node current iX2 flowing in the NMOS transistor N4 has been reduced by 5 μA so that it becomes 95 μA. In this state, the respective currents to be flown by the constant current source ie and the constant current source if are constantly kept at 100 μA and therefore the resistor element Rc has to flow such a current that meets these constant currents. Of the node current iX1 of 105 μA, 100 μA flows into the constant current source ie while the remaining excessive current of 5 μA flowing into the constant current source if through the resistor element Rc. Flowing into the constant current source if is 100 μA, that is, the sum of the node current iX2 (95 μA) and the excessive current (5 μA) of the node current iX1 flowing through the resistor element Rc.

Specifically, the differential amplifier circuit 1 operates such that the current flowing from the NMOS transistor N3 into the constant current source if through the resistor element Rc becomes 5 μA. The gate voltage of the NMOS transistor N4 is kept equal to the reference voltage esg=2.0V. Therefore, the current to be flown in the resistor element Rc is set by increasing the gate voltage of the NMOS transistor N3. Since the resistance value of the resistor element Rc is 100 kΩ, a voltage difference of 0.5V is necessary for flowing a current of 5 μA. Since the NMOS transistor N3 and the NMOS transistor N4 have the same gate-source voltage difference, the op-amp OP operates such that the gate voltage of the NMOS transistor N3 becomes 0.5 V higher than that of the NMOS transistor N4.

In this case, the feedback terminal FB, which is the gate terminal of the NMOS transistor N3, is biased by the op-amp OP. The op-amp OP operates, being supplied with the second supply voltage VH and the second ground voltage GND. In contrast with this, the first differential pair, composed of the NMOS transistors N1, N2 and connected to the input terminals IM, IP, operates, being supplied with the first supply voltage AVD and the first ground voltage AVS that are independent of the second supply voltage VH and the second ground voltage GND. Therefore, the op-amp OP and the second differential pair composed of the NMOS transistors N3, N4 operate independently of the voltage range of the differential input signal input to the input terminals IM, IP.

Accordingly, the voltage value of the reference voltage esg can be set independently of the voltage range of the differential input signal.

All of the current (105 μA) left after elimination of the current flowing in the NMOS transistor N1 from the constant current source ia becomes the node current iX1, flowing into the NMOS transistor N3. All of the current (95 μA) left after elimination of the current flowing in the NMOS transistor N2 from the constant current source ib becomes the node current iX2, flowing into the NMOS transistor N4. Thereby, the current flowing in the resistor element Ra becomes 0 μA and no voltage difference appears between both ends of the resistor element Ra.

As has been described above, the differential voltage applied to the input terminals IM and IP becomes a differential voltage between both ends of the resistor element Rc after once converted into a current. This differential voltage is led to the feedback terminal FE and signal ground terminal SG which are the gate terminals of the NMOS transistors N3, N4, respectively. As a result, the voltage obtained by adding the differential voltage of the differential input signal to the reference voltage esg applied to the signal ground terminal SG is output to the feedback terminal FB. In this case, the second supply voltage VH and the second ground voltage GND, which are to be supplied to the op-amp OP, are set independently of the first supply voltage AVD and the first ground voltage AVS which are supplied to the NMOS transistors N1, N2 connected to the input terminals IM, IP. Therefore, the voltage range of the output signals to be output to the feedback terminal FB, that is, the output terminal OUT can be set independently of the voltage range of the differential input signal applied to the input terminals IM, IP.

While the first embodiment has been described with a case where the resistance values of the resistor elements Rb and Rc are the same, that is, 100 kΩ, a transition in the voltage of the output signal of the op-amp OP when the resistance values of these resistor elements Rb, Rc differ from each other will be explained below. If the gain G of the differential amplifier circuit $1=\Delta Vout/\Delta Vin$ (where $\Delta Vin$ represents the differential voltage obtained from the voltage of the input terminal IP–the voltage of the input terminal IM; and $\Delta Vout$ represents the output voltage of the op-amp OP when the output voltage of the op-amp OP–$\Delta Vin=0$ provided that $\Delta Vin \neq 0$), the op-amp OP operates such that the voltage difference between both ends of the resistor element Ra becomes 0V. Specifically, the op-amp OP operates such that the current flowing in the resistor element Rb and the current flowing in the resistor element Rc become equal to each other as described earlier. Since $iRb=\Delta Vin/Rb$ and $iRc=\Delta Vout/Rc$ where the current flowing in the resistor element Rb is designated by iRb and the current flowing in the resistor element Rc is designated by iRc, the relationship described by $\Delta Vin/Rb=\Delta Vout/Rc$ holds. From this equation, $\Delta Vout/\Delta Vin=Rc/Rb$ and gain $G=Rc/Rb$ are derived.

As has been described, the differential amplifier circuit 1 of the first embodiment is constituted by four NMOS transistors N1 to N4, three resistor elements Ra to Rc, six constant current sources ia to if, and one op-amp OP. The differential amplifier circuit 1 has high impedance at each of the input terminals IM, IP and can release an output signal independent of the voltage range of the differential input signal. In contrast with this, the prior art technique shown in FIG. 11 requires four op-amps OP1 to OP4 and four resistor elements R1 to R4 to constitute a differential amplifier circuit having the same function. Thus, the differential amplifier circuit 1 of the first embodiment has a much simpler circuit configuration.

In the differential amplifier circuit 1, the first differential pair composed of the NMOS transistors N1, N2, the constant current sources ia, ib, ic, id and the resistor element Rb constitute a voltage/current converting section. And, the resistor element Ra, the op-amp OP, the second differential pair composed of the NMOS transistors N3, N4, the resistor element Rc and the constant current source ie, if constitute a current/voltage converting section.

The voltage/current converting section is supplied with the first supply voltage AVD and the first ground voltage AVS. The current/voltage converting section is supplied with the second supply voltage VH and the second ground voltage GND which are independent of the first supply voltage AVD and the first ground voltage AVS.

Accordingly, with a simple circuit configuration, the voltage range of the reference voltage esg to be applied to the signal ground terminal SG can be set independently of the voltage range of the differential input signal input to the input terminals IP, IM and a differential voltage can be obtained from the feedback terminal FB.

Figure 7:
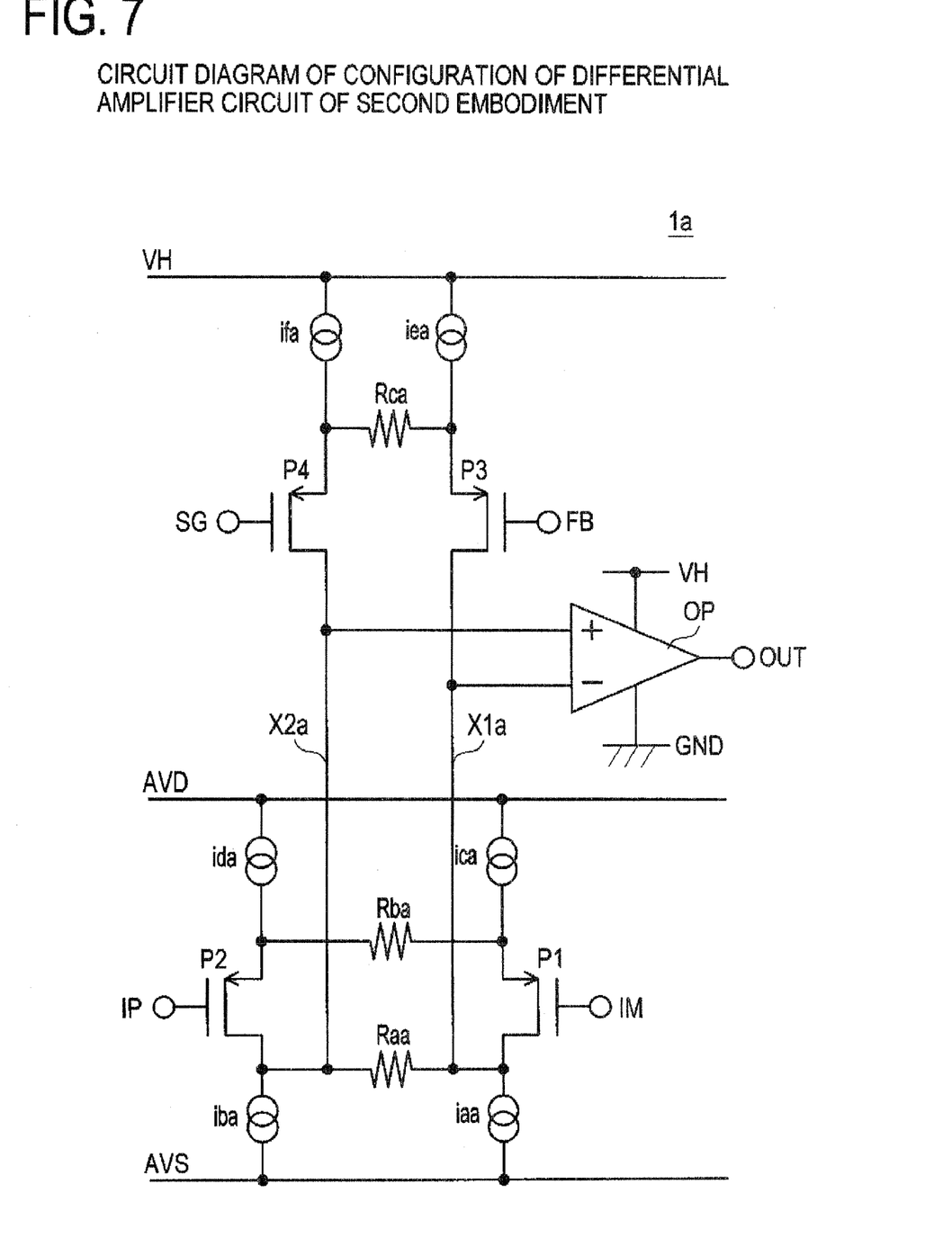
FIG. 7 is a circuit diagram showing the configuration of the differential amplifier circuit of the second embodiment.

First, a differential amplifier circuit 1a will be described according to a second embodiment. FIG. 7 is a circuit diagram showing the configuration of the differential amplifier circuit 1a of the second embodiment. The differential amplifier circuit 1a includes PMOS transistors P1, P2, P3, P4, constant current sources iaa, iba, ica, ida, iea, ifa, resistor elements Raa, Rba, Rca and an op-amp OP. The PMOS transistors P1, P2 and the resistor element Rba constitute a first differential pair whereas the PMOS transistors P3, P4 and the resistor element Rca constitutes a second differential pair. Herein, the PMOS transistors P1, P2 have the same transistor size and the PMOS transistors P3, P4 have the same transistor size.

The PMOS transistors P1 has a source terminal to which one end of the constant current source ica is connected, a gate terminal to which an input terminal IM is connected, and a drain terminal to which a node X1a is connected. The PMOS transistors P2 has a source terminal to which one end of the constant current source ida is connected, a gate terminal to which an input terminal IP is connected, and a drain terminal to which a node X2a is connected. Connected between the source terminal of the PMOS transistor P1 and the source terminal of the PMOS transistor P2 is the resistor element Rba. The other end of each of the constant current sources ica and ida is connected to a first supply voltage AVD.

The PMOS transistors P3 has a source terminal to which one end of the constant current source iea is connected, a gate terminal to which a feedback terminal FB is connected, and a drain terminal to which the node X1a is connected. Although not shown in FIG. 7, the feedback terminal FB is normally connected to the output terminal OUT of the op-amp OP. The PMOS transistors P4 has a source terminal to which one end of the constant current source ifa is connected, a gate terminal to which a signal ground terminal SG is connected, and a drain terminal to which the node X2a is connected. Connected between the source terminal of the PMOS transistor P3 and the source terminal of the PMOS transistor P4 is the resistor element Rca. The other end of each of the constant current sources iea and ifa is connected to a second supply voltage VH.

Connected to the node X1a is one end of the constant current source iaa. Connected to the node X2a is one end of the constant current source iba. Connected between the node X1a and the node X2a is the resistor element Raa. The op-amp OP has an inverting terminal connected to the node X1a and a noninverting terminal connected to the node X2a. The other end of each of the constant current sources iaa and iba is connected to a first ground voltage AVS. In addition, the op-amp OP is connected to the second supply voltage VH and a second ground voltage GND which are set independently of the first supply voltage AVD and the first ground voltage AVS.

Herein, a current equal to the constant current source iba flows in the constant current source iaa, a current equal to the constant current source ida flows in the constant current source ica, and a current equal to the constant current source ifa flows in the constant current source iea. The current flowing in the constant current source iaa is the sum current of the current flowing in the constant current source ica and the current flowing in the constant current source iea. The current flowing in the constant current source iba is the sum current of the current flowing in the constant current source ida and the current flowing in the constant current source ifa.

The constant current sources iaa, iba, ica, ida, iea, ifa use the same current mirror circuits as of the constant current sources ia, ib, ic, id, ie, if, respectively, of the first embodiment to reverse the polarities of the transistors used and the polarities of connection to the constant current sources.

Figure 8:
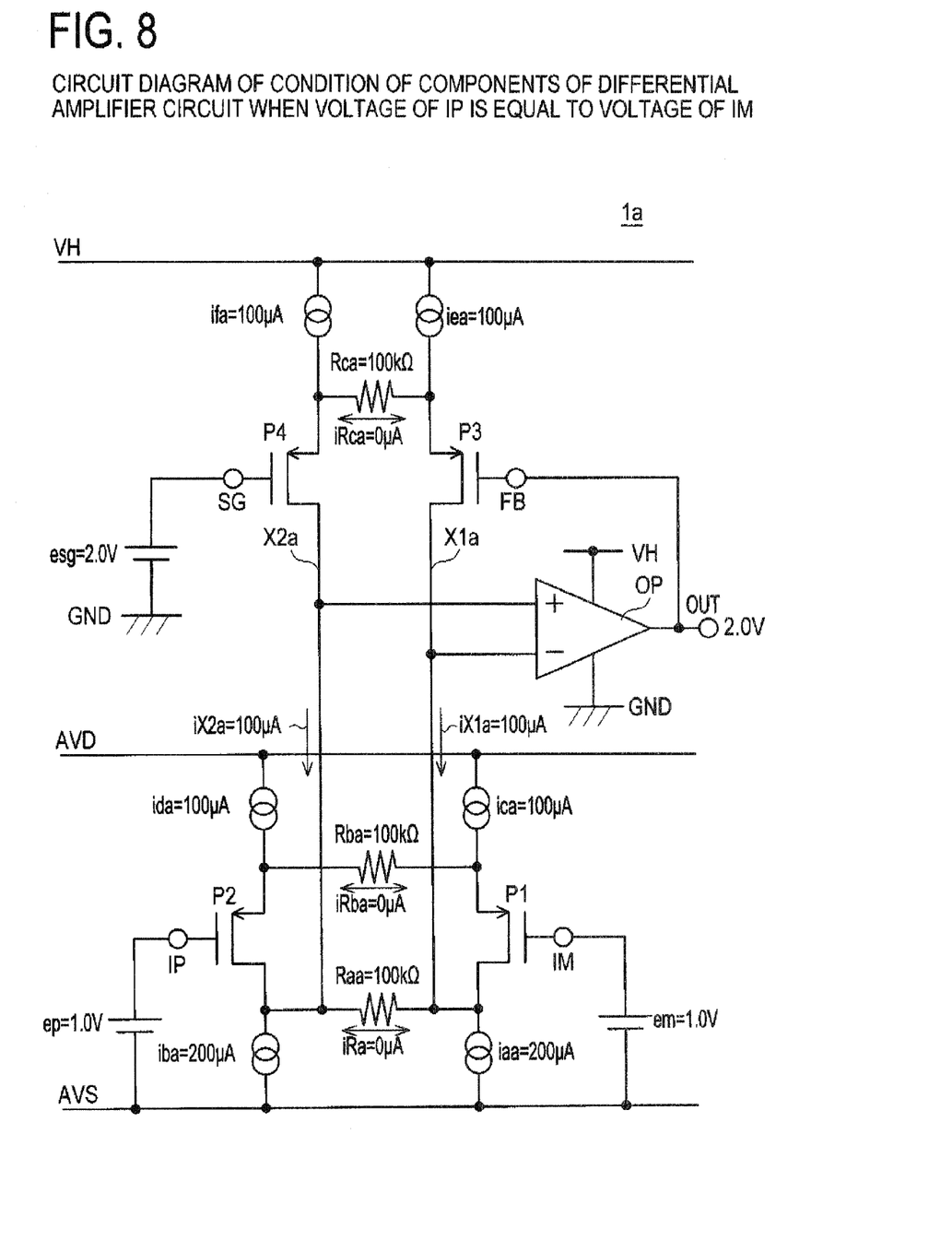
FIG. 8 is a circuit diagram showing the respective conditions of the components of the differential amplifier circuit when the voltage of IP is equal to the voltage of IM.

Next, the operation of the differential amplifier circuit 1a when the voltage of the input terminal IP is equal to the voltage of the input terminal IM will be explained. FIG. 8 is a circuit diagram showing the respective conditions of the components of the differential amplifier circuit 1a.

Herein, the currents of the constant current sources iaa, iba are each set to 200 µA and the currents of the constant current sources ica, ida, iea, ifa are each set to 100 µA. The resistance values of the resistor elements Raa, Rba, Rca are each set to 100 kΩ. The feedback terminal FB is connected to the output terminal OUT and the signal ground terminal SG is connected to the reference voltage esg=2.0V.

If 1.0V is applied to the input terminals IM and IP at that time, the source terminal of the PMOS transistor P1 and the source terminal of the PMOS transistor P2 will have the same voltage because the gate-source voltage of the PMOS transistor P1 is equal to the gate-source voltage of the PMOS transistor P2. Accordingly, no voltage difference will appear between both ends of the resistor element Rba and therefore no current will flow in the resistor element Rba.

Since no current flows in the resistor element Rba, all the current flowing from the constant current source ica flows in the PMOS transistor P1 and all the current flowing from the constant current source ida flows in the PMOS transistor P2. Both of the currents flowing in the PMOS transistors P1 and P2 are 100 µA. The differential current between the current (200 µA) flowing in the constant current source iaa and the current (100 µA) flowing in the PMOS transistor P1 is 100 µA. Therefore, the current flowing out from the PMOS transistor P3 is 100 µA. The differential current between the current (200 µA) flowing in the constant current source iba and the current (100 µA) flowing in the PMOS transistor P2 is 100 µA. Therefore, the current flowing out from the PMOS transistor P4 is 100 µA. That is, the current directed to the constant current source iaa flows into the PMOS transistors P1, P3 whereas the current directed to the constant current source iba flows into the PMOS transistors P2, P4, so that no current flows in the resistor element Raa and no voltage difference appears between both ends of the resistor element Raa.

All of the current (100 µA) to be flown by the constant current source iea is supplied through the PMOS transistor P3, whereas all of the current (100 µA) to be flown by the constant current source ifa is supplied through the PMOS transistor P4. Therefore, the current flown by the constant current sources iea and ifa does not flow through the resistor element Rca. Thereby, the voltage difference between both ends of the resistor element Rca becomes 0V. As a result, the source terminals of the PMOS transistors P3, P4 have the same voltage.

In addition, since the PMOS transistors P3, P4 are of the same transistor size, the gate-source voltage of the PMOS transistor P3 and the gate-source voltage of the PMOS transistor P4 operate at the same voltage. Therefore, the gate voltage of the PMOS transistor P3 and the gate voltage of the PMOS transistor P4 must have the same value.

The op-amp OP operates such that the gate voltages of the PMOS transistor P3 and the PMOS transistor P4 become equal to each other. Since the signal ground terminal SG, which is the gate voltage of the PMOS transistor P4, is 2.0V, the op-amp OP operates such that the feedback terminal FB, which is the gate voltage of the PMOS transistor P3, becomes 2.0V and the voltage value of the output terminal OUT becomes 2.0V.

The second supply voltage VH and the second ground voltage GND supplied to the op-amp OP are set independently from the first supply voltage AVD and the first ground voltage ADS which are supplied to the first differential pair having the PMOS transistors P1, P2 connected to the input terminals IM, IP. Therefore, the reference voltage esg applied to the signal ground terminal SG is not limited to 2.0V but can be arbitrarily set, and an output signal within a voltage range corresponding to the set reference voltage is output from the feedback terminal FB (output terminal OUT).

Figure 9:
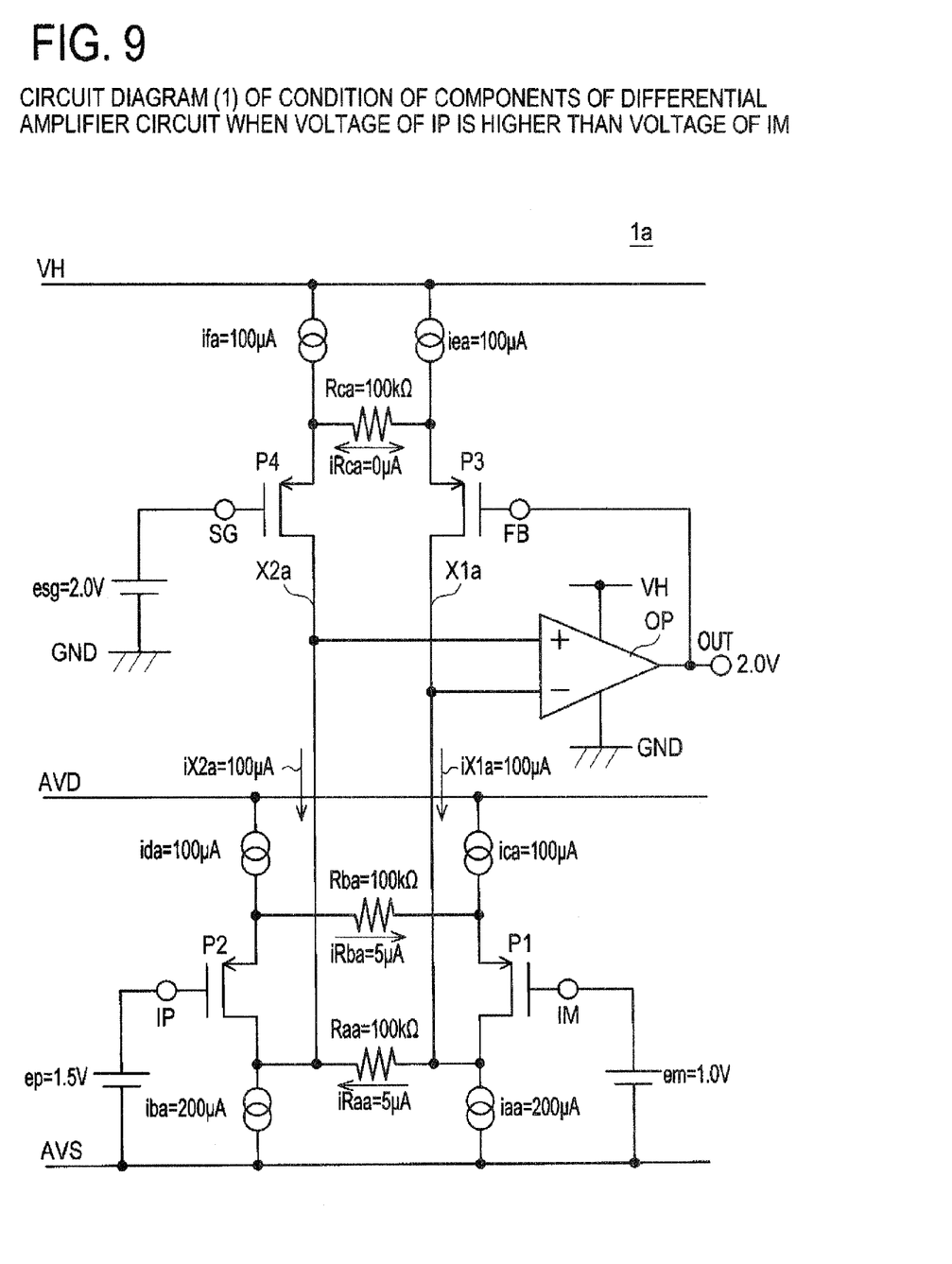
FIG. 9 is a circuit diagram (1) showing the respective conditions of the components of the differential amplifier circuit when the voltage of IP is higher than the voltage of IM.
Figure 10:
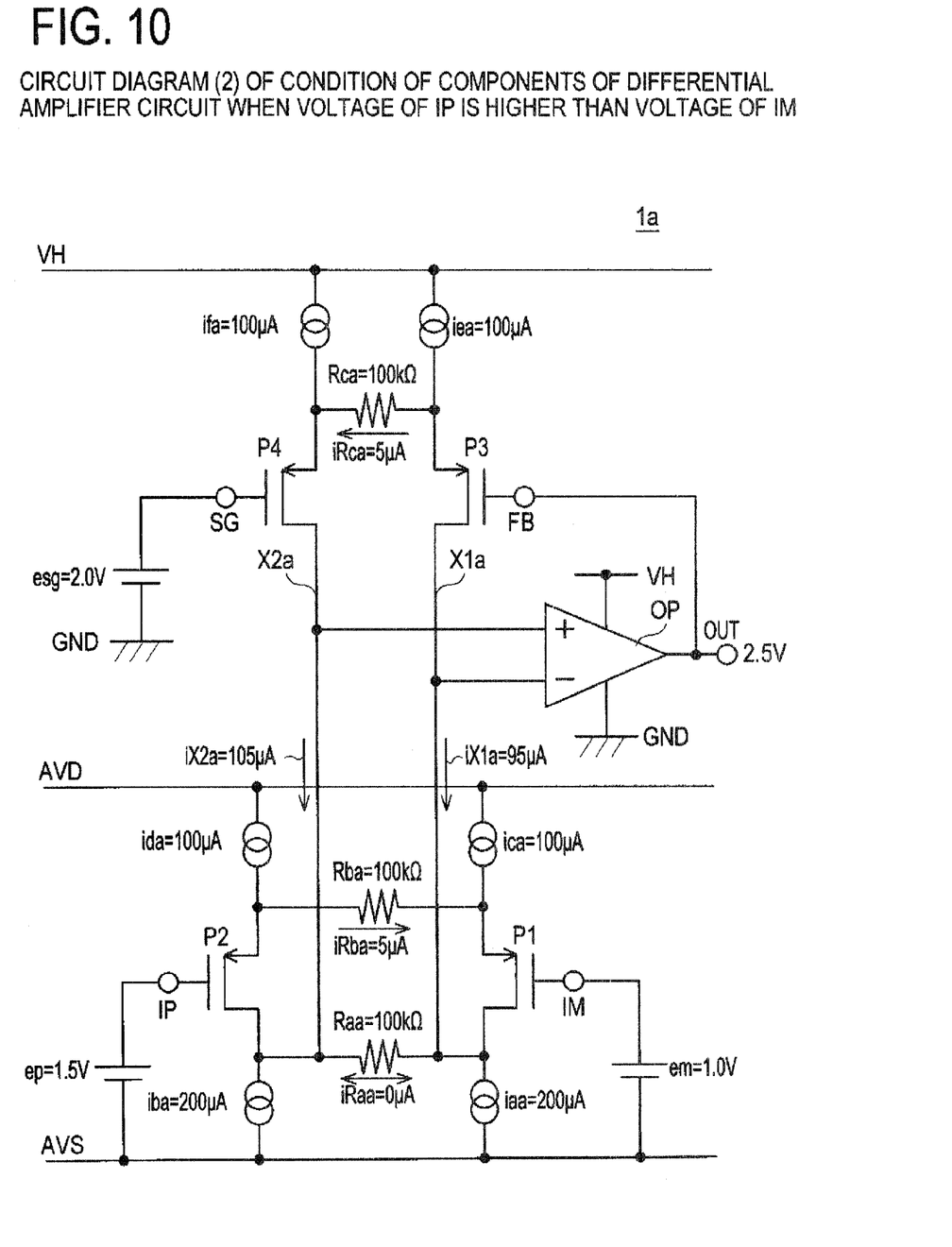
FIG. 10 is a circuit diagram (2) showing the respective conditions of the components of the differential amplifier circuit when the voltage of IP is higher than the voltage of IM.

Next, the operation of the differential amplifier circuit 1a when the voltage of the input terminal IP is higher than the voltage of the input terminal IM will be explained. FIGS. 9 and 10 are circuit diagrams each showing the respective conditions of the components of the differential amplifier circuit 1a. Specifically, FIG. 9 shows a transitional state just after the voltage of the input terminal IP has changed, whereas FIG. 10 shows a state in which the components have been restored to their respective normal states.

Similarly to FIG. 8, the currents of the constant current sources iaa, iba are each set to 200 µA and the currents of the constant current sources ica, ida, iea, ifa are each set to 100 µA. The resistance values of the resistor elements Raa, Rba, Rca are each set to 100 kΩ. The feedback terminal FB is connected to the output terminal OUT and the signal ground terminal SG is connected to the reference voltage esg=2.0V.

In FIG. 9, if 1.0V is applied to the input terminal IM and 1.5V is applied to the input terminal IP, a voltage of 0.5V will be applied across the resistor element Rba because the gate-source voltage of the PMOS transistor P1 is equal to the gate-source voltage of the PMOS transistor P2. Since the resistance value of the resistor element Rba is 100 kΩ, a current of 5 µA will flow from the source terminal side of the PMOS transistor P2 to the source terminal side of the PMOS transistor P1 in the resistor element Rba.

Since the current flowing in the constant current sources ica, ida is constantly kept at 100 µA, the current flowing in the PMOS transistor P1 becomes 105 µA that is obtained by adding the current (5 µA) flowing in the resistor element Rba to the current (100 µA) flowing out from the constant current source ica. The current flowing in the PMOS transistor P2 becomes 95 µA that is obtained by subtracting the current (5 µA) flowing in the resistor element Rba from the current (100 µA) flowing out from the constant current source ida.

The current left after subtraction of the current flowing in the PMOS transistor P1 from the constant current source iaa is 95 µA. The current left after subtraction of the current flowing in the PMOS transistor P2 from the constant current source iba is 105 µA. Each of the constant current sources iea, ifa is a 100 µA constant current source. Therefore, the current 105 µA, which is left after the subtraction of the current flowing in the PMOS transistor P2 from the constant current source iba, branches into two currents, one being 100 µA that is supplied from the constant current source ifa as the node current iX2a after flowing in the PMOS transistor P4, whereas the other is 5 µA that flows in a direction toward the constant current source iba through the resistor element Raa. After a current of 95 µA, which is left after subtraction of the current flowing in the PMOS transistor P1 from the constant current source iaa, is supplied from the node current iX1a of 100 µA which flows from the constant current source iea through the PMOS transistor P3. The remaining 5 µA of the node current iX1a flows in the resistor element Raa.

The current flowing in the resistor element Raa is 5 µA. Since the resistance value of the resistor element Raa is 100 kΩ, a voltage difference of 0.5V appears between both ends of the resistor element Raa with the drain terminal side of the PMOS transistor P1 having higher potential. At that time, the gate voltages of the PMOS transistor P3 and the PMOS transistor P4 have not changed yet and therefore, a voltage difference has not appeared between both ends of the resistor element Rca. Therefore, no current does not flow in the resistor element Rca.

The current flowing in the resistor element Rca is dependent upon the source voltage difference between the PMOS transistor P3 and the PMOS transistor P4. Since the PMOS transistor P3 and the PMOS transistor P4 have the same gate-source voltage, the gate voltage difference between them has to be controlled. The gate voltage of the PMOS transistor P4 is equal to the reference voltage esg=2.0V applied to the signal ground terminal SG, and the gate voltage of the PMOS transistor P3 is equal to the voltage of the output terminal OUT of the op-amp OP connected to the feedback terminal FB.

Input to the noninverting input terminal and inverting input terminal of the op-amp OP is a voltage difference that appears between both ends of the resistance element Raa. The op-amp OP operates so as to eliminate the voltage difference between the noninverting input terminal and the inverting input terminal, because its output terminal OUT is connected to the feedback terminal FB that is the gate terminal of the PMOS transistor P3. More concretely, the op-amp OP operates in a direction in which 5 µA flowing from the resistor element Raa into the constant current source iba is eliminated to null the voltage difference between both ends of the resistor element Raa, that is, a direction in which the node current iX1a flowing in the PMOS transistor P3 is reduced by 5 µA while the node current iX2a flowing in the PMOS transistor P4 being increased by 5 µA.

FIG. 10 shows a state where the node current iX1a flowing in the PMOS transistor P3 has been reduced by 5 µA so that it becomes 95 µA and the node current iX2a flowing in the PMOS transistor P4 has been increased by 5 µA so that it becomes 105 µA. In this state, the respective currents to be flown by the constant current source iea and the constant current source ifa are kept at 100 µA and therefore the resistor element Rca has to flow such a current that meets these constant currents. Of the node current iX2a of 105 µA, 100 µA flows from the constant current source ifa while the remaining shortage current 5 µA flowing from the constant current source iea through the resistor element Rca. Flowing from the constant current source iea is 100 µA, that is, the node current iX2a (95 µA) plus the shortage current (5 µA) of the node current iX1a flowing through the resistor element Rca.

Specifically, the differential amplifier circuit 1a operates such that the current flowing from the constant current source iea into the PMOS transistor P4 through the resistor element Rca becomes 5 µA. The gate voltage of the PMOS transistor P4 is kept equal to the reference voltage esg=2.0V. Therefore, the current to be flown in the resistor element Rca is set by increasing the gate voltage of the PMOS transistor P3. Since the resistance value of the resistor element Rca is 100 kΩ, a voltage difference of 0.5V is necessary for flowing a current of 5 µA. Since the PMOS transistor P3 and the PMOS transistor P4 have the same gate-source voltage difference, the op-amp OP operates such that the gate voltage of the PMOS transistor P3 becomes 0.5 V higher than that of the PMOS transistor P4.

In this case, the feedback terminal FB, which is the gate terminal of the PMOS transistor P3, is biased by the op-amp OP. The op-amp OP operates, being supplied with the second supply voltage VH and the second ground voltage GND. In contrast with this, the first differential pair, composed of the PMOS transistors P1, P2 and connected to the input terminals IM, IP, operates, being supplied with the first supply voltage AVD and the first ground voltage AVS that are independent of the second supply voltage VH and the second ground voltage GND. Therefore, the op-amp OP and the second differential pair composed of the PMOS transistors P3, P4 operate independently of the voltage range of the differential input signal input to the input terminals IM, IP. Accordingly, the voltage value of the reference voltage esg can be set independently of the voltage range of the differential input signal.

All of the current (95 µA) left after elimination of the current flowing in the PMOS transistor P1 from the constant current source iaa becomes the node current iX1a and flows into the PMOS transistor P3. All of the current (105 µA) left after elimination of the current flowing in the PMOS transistor P2 from the constant current source iba becomes the node current iX2a and flows into the PMOS transistor P4. Thereby, the current flowing in the resistor element Raa becomes 0 µA and, in consequence, no voltage difference appears between both ends of the resistor element Raa.

As has been described above, the differential voltage applied to the input terminals IM and IP becomes a differential voltage between both ends of the resistor element Rca, after once converted into a current. This differential voltage is led to the feedback terminal FB and the signal ground terminal SG which are the gate terminals of the PMOS transistors P3, P4 respectively. As a result, the voltage obtained by adding the differential voltage between the input terminals IM, IP to the reference voltage esg applied to the signal ground terminal SG is output to the feedback terminal FB. In this case, the second supply voltage VH and the second ground voltage GND, which are to be supplied to the op-amp OP, are set independently of the first supply voltage AVD and the first ground voltage AVS which are supplied to the PMOS transistors P1, P2 connected to the input terminals IM, IP. Therefore, the voltage range of the output signals to be output to the feedback terminal FB, that is, the output terminal OUT can be set independently of the voltage range of the differential input signal applied to the input terminals IM, IP.

As regard to the case where the resistance values of the resistor elements Rba and Rca differ from each other, the second embodiment does not differ from the first embodiment. That is, if the gain G of the differential amplifier circuit 1a=ΔVout/ΔVin, ΔVout/ΔVin=Rca/Rba and gain G=Rca/Rba, similarly to the first embodiment.

It is apparent that the disclosure is not necessarily limited to the particular embodiments shown herein and various changes and modifications are made to the disclosed embodiments without departing from the spirit and scope of the disclosure.

For instance, the disclosure is applicable to cases where the differential amplifier circuit uses bipolar transistors in place of the NMOS transistors or PMOS transistors.

In addition, either the first and second supply voltages VH, AVD or the first and second ground voltages GND, AVS may have the same potential. For example, the first and second ground voltages GND, AVS may have the same potential.

It should be noted that the NMOS transistors N1, N2 in combination with the resistor element Rb serve as one example of the first differential pair; the NMOS transistors N3, N4 in combination with the resistor element Rc serve as one example of the second differential pair; and the nodes X1, X2 serve as one example of the drain terminals of the first and second differential pairs. The constant current source ic serves as one example of the first constant current source; the constant current source id serves as one example of the second constant current source; the constant current source ie serves as one example of the third constant current source; the constant current source if serves as one example of the fourth constant current source; the constant current source ia serves as one example of the fifth constant current source; and the constant current source ib serves as one example of the sixth constant current source. The resistor element Ra serves as one example of the first resistor element; the resistor element Rb serves as one example of the second resistor element; and the resistor element Rc serves as one example of the third resistor element.

It should be noted that the PMOS transistors P1, P2 in combination with the resistor element Rba serve as one example of the first differential pair; the PMOS transistors P3, P4 in combination with the resistor element Rca serve as one example of the second differential pair; and the nodes X1a, X2a serve as one example of the drain terminals of the first and second differential pairs. The constant current source ica serves as one example of the first constant current source; the constant current source ida serves as one example of the second constant current source; the constant current source iea serves as one example of the third constant current source; the constant current source ifa serves as one example of the fourth constant current source; the constant current source iaa serves as one example of the fifth constant current source; and the constant current source iba serves as one example of the sixth constant current source. The resistor element Raa serves as one example of the first resistor element; the resistor element Rba serves as one example of the second resistor element; and the resistor element Rca serves as one example of the third resistor element.

The NMOS transistors N1, N2, the constant current sources ia, ib, ic, id and the resistor element Rb serve, in combination, as one example of the voltage/current converting section; the PMOS transistors P1, P2, the constant current sources iaa, iba, ica, ida and the resistor element Rba serve, in combination, as one example of the voltage/current converting section; the resistor element Ra, the op-amp OP, the NMOS transistors N3, N4, the resistor element Rc and the constant current sources ie, if serve, in combination, as one example of the current/voltage converting section; and the resistor element Raa, the op-amp OP, the PMOS transistors P3, P4, the resistor element Rca and the constant current sources iea, ifa serve, in combination, as one example of the current/voltage converting section.

The disclosure provides a differential amplifier circuit of simple circuit configuration, which is capable of releasing an output signal within a voltage range independent of the voltage range of a differential input signal.

The voltage/current converting section and the current/voltage converting section are supplied with electric power from the first and second supply voltages, respectively, which are independent from each other. Therefore, the input voltage ranges of the voltage/current converting section and the current/voltage converting section can be set independently from each other. This makes it possible to independently set the voltage range of the differential input signal input to the voltage/current converting section and the voltage range of the reference signal input to the current/voltage converting section, respectively. As a result, the voltage range of the reference voltage can be set independently of the voltage range of the differential input signal to output an output signal.

What is claimed is:

1. A differential amplifier circuit comprising:
   a voltage/current converting section that operates at a first supply voltage to convert a differential voltage of a differential input voltage into a current according to the differential voltage; and
   a current/voltage converting section that operates at a second supply voltage independent of the first supply voltage to convert a current output from the voltage/current converting section into a voltage according to the current, thereby outputting an output voltage based on the voltage and a reference voltage.

2. The differential amplifier circuit according to claim 1, wherein the voltage/current converting section includes a first differential pair that receive the differential input voltage and a first resistor element coupled between drain terminals of the first differential pair,
   wherein the current/voltage converting section includes an operational amplifier coupled to each of the drain terminals of the first differential pair and a second differential pair that receive a voltage corresponding to an output voltage of the operational amplifier and the reference voltage, and
   wherein the drain terminals of the first differential pair are coupled to drain terminals, respectively, of the second differential pair.

3. The differential amplifier circuit according to claim 2, further comprising:
   a first constant current source one end of which is coupled to a source terminal of a transistor coupled to a first input terminal of the first differential pair; and
   a second constant current source in which a current having the same current value as the current value of the first constant current source flows and one end of which is coupled to a source terminal of a transistor coupled to a second input terminal of the first differential pair.

4. The differential amplifier circuit according to claim 3, further comprising:
   a third constant current source one end of which is coupled to a source terminal of a transistor coupled to a first input terminal of the second differential pair; and
   a fourth constant current source in which a current having the same current value as the current value of the third constant current source flows and one end of which is coupled to a source terminal of a transistor coupled to a second input terminal of the second differential pair.

5. The differential amplifier circuit according to claim 4, further comprising:
   a fifth constant current source one end of which is coupled to a drain terminal of the transistor coupled to the first input terminal of the first differential pair; and
   a sixth constant current source in which a current having the same current value as the current value of the fifth constant current source flows and one end of which is coupled to a drain terminal of the transistor coupled to the second input terminal of the first differential pair.

6. The differential amplifier circuit according to claim 5, wherein the fifth constant current source flows a sum current of the first constant current source and the third constant current source; and
wherein the sixth constant current source flows a sum current of the second constant current source and the fourth constant current source.

7. The differential amplifier circuit according to claim 2, wherein the first differential pair has source terminals between which a second resistor element is coupled, and
wherein the second differential pair has source terminals between which a third resistor element is connected.

8. The differential amplifier circuit according to claim 7, which has a gain represented by gain $G=\Delta Vout/\Delta Vin=Rc/Rb$ where $\Delta Vin$ represents a differential voltage of a voltage input to a differential input terminal of the first differential pair; $\Delta Vout$ represents a differential voltage obtained from subtraction of an output voltage of the operational amplifier when the $\Delta Vin=0$ from an output voltage of the operational amplifier when $\Delta Vin \neq 0$; Rb represents a resistance value of the second resistor element; and Rc represents a resistance value of the third resistor element.

9. The differential amplifier circuit according to claim 2, wherein the first differential pair includes an NMOS transistor configured to input the differential input voltage, and
wherein the second differential pair includes an NMOS transistor that receives a voltage corresponding to the reference voltage and an output voltage of the operational amplifier.

10. The differential amplifier circuit according to claim 2, wherein the first differential pair includes a PMOS transistor that receives the differential input voltage, and
wherein the second differential pair includes a PMOS transistor that receives a voltage corresponding to the reference voltage and an output voltage of the operational amplifier.

11. The differential amplifier circuit according to claim 1, wherein the voltage/current converting section converts the differential voltage into a current proportional to the differential voltage,
wherein the current/voltage converting section converts the current output from the voltage/current converting section into a voltage according to the current and obtains the output voltage by addition or subtraction of the voltage obtained after the conversion to or from the reference voltage.

* * * * *